US008926775B2

(12) United States Patent
Thallner

(10) Patent No.: US 8,926,775 B2
(45) Date of Patent: Jan. 6, 2015

(54) METHOD AND DEVICE FOR BONDING TWO WAFERS

(76) Inventor: Erich Thallner, St. Florian (AT)

(*) Notice: Subject to any disclaimer, the term of this patent is extended or adjusted under 35 U.S.C. 154(b) by 0 days.

(21) Appl. No.: 14/113,256

(22) PCT Filed: Mar. 30, 2012

(86) PCT No.: PCT/EP2012/055840
§ 371 (c)(1),
(2), (4) Date: Oct. 22, 2013

(87) PCT Pub. No.: WO2012/152507
PCT Pub. Date: Nov. 15, 2012

(65) Prior Publication Data
US 2014/0196846 A1 Jul. 17, 2014

(30) Foreign Application Priority Data
May 11, 2011 (AT) .................... A 666/2011

(51) Int. Cl.
B32B 37/00 (2006.01)
H01L 21/71 (2006.01)
H01L 21/67 (2006.01)
H01L 21/18 (2006.01)
H01L 21/20 (2006.01)

(52) U.S. Cl.
CPC .......... *H01L 21/71* (2013.01); *H01L 21/67092* (2013.01); *H01L 21/187* (2013.01); *H01L 21/2007* (2013.01); *H01L 21/67* (2013.01)
USPC .......................................... 156/228; 156/580

(58) Field of Classification Search
USPC ................ 156/228, 580, 581, 583.1
See application file for complete search history.

(56) References Cited

U.S. PATENT DOCUMENTS

| 4,787,951 | A | 11/1988 | Okamoto ................ 156/285 |
| 5,769,991 | A | 6/1998 | Miyazawa et al. ........... 156/153 |
| 6,129,811 | A | 10/2000 | McKenna et al. ............ 156/391 |
| 6,383,890 | B2 * | 5/2002 | Takisawa et al. ............ 438/455 |
| 2003/0148596 | A1 | 8/2003 | Kellar et al. ................ 438/612 |
| 2007/0148911 | A1 | 6/2007 | Chang et al. ................ 438/455 |

FOREIGN PATENT DOCUMENTS

| EP | 0 926 706 | 6/1999 | ............ H01L 21/00 |
| JP | 61-81474 | 4/1986 | ............ C09J 5/00 |
| JP | 2000-188245 | 7/2000 | ............ H01L 21/02 |
| JP | 2006-32815 | 2/2006 | ............ H01L 21/683 |
| JP | 2010-245396 | 10/2010 | ............ H01L 21/02 |

OTHER PUBLICATIONS

International Search Report for International Application No. PCT/EP2012/055840, Jun. 15, 2013.

* cited by examiner

Primary Examiner — James Sells
(74) Attorney, Agent, or Firm — Kusner & Jaffe

(57) ABSTRACT

A device for bonding of two wafers on one joining surface V of the wafers. The device includes a pressure transfer means with a pressure surface D for applying a bond pressure to the two wafers on the pressure surface D, wherein the pressure surface D is smaller than the joining surface V. The invention also relates to a method for bonding of two wafers on one joining surface V of the two wafers, by pressure transfer means with a pressure surface D for action on the wafers (2, 3), wherein a bond pressure is applied in succession to partial sections of the joining surface V.

12 Claims, 5 Drawing Sheets

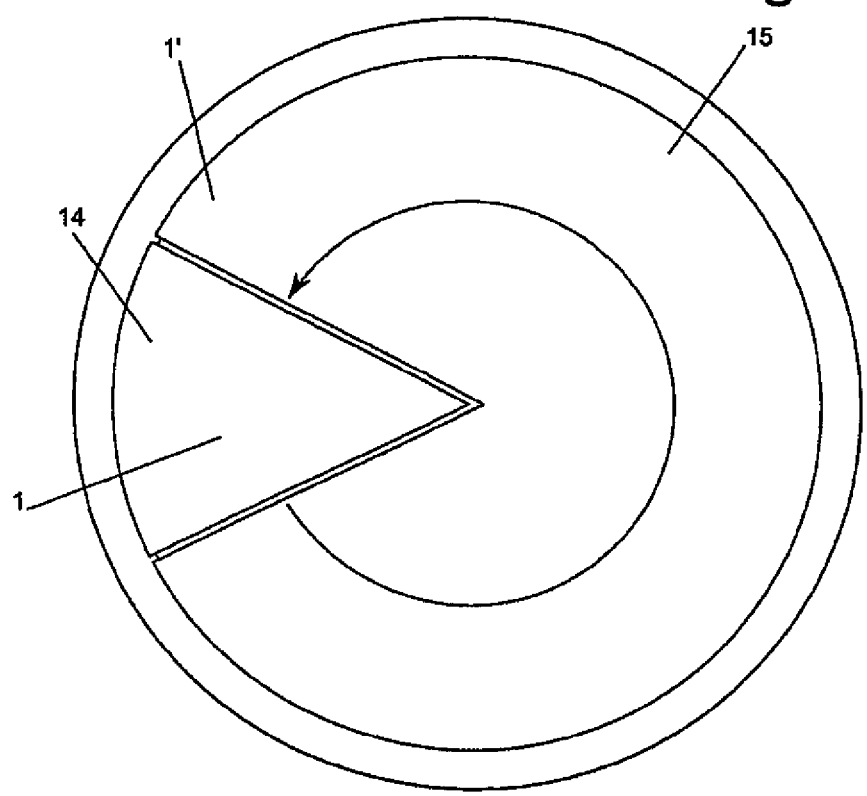

METHOD AND DEVICE FOR BONDING TWO WAFERS

FIELD OF THE INVENTION

This invention relates to a device for especially permanent bonding of two wafers, especially structure wafers, and a corresponding method.

BACKGROUND OF THE INVENTION

The permanent joining or bonding of structure wafers takes place preferably by diffusion bonds, eutectic bonds or glass frit bonds, Cu—Cu combinations in recent years being especially preferred for many applications.

High temperatures and/or pressures for a stable irreversible bond are necessary for the joining.

In structure wafers which are becoming thinner and thinner in diameter and larger and larger in area, major difficulties always arise for bonding methods, especially since the yield of chips is to be as large as possible. On the other hand, there is the requirement of economical and careful production of a permanent bond on the joining surface or contact surface between the wafers.

SUMMARY OF THE INVENTION

An object of this invention is to devise a device and a method for bonding of wafers with which careful, effective and economical production of a bond, especially a permanent bond, is enabled.

This object is achieved with the features recited in the independent claim(s). Advantageous developments of the invention are given in the dependent claims. All combinations of at least two of the features given in the specification, the claims and/or the figures also fall within the scope of the invention. At the given value ranges, values within the indicated limits will also be considered to be disclosed as boundary values and will be claimed in combination.

The basic idea of this invention is to provide pressure transfer means with which the bond pressure is applied in succession to component sections of the joining surface between the two wafers. In other words, the pressure surface for application of the bond pressure to the wafers is smaller, in particular distinctly smaller, than the joining surface of the two wafers. Thus it is possible to reduce the compressive force which is to be applied overall for a certain time, as a result of which on the one hand the material is protected and on the other the devices can be produced much more economically.

Especially in making direct contact of a wafer and the pressure surface is the action of the invention such that the mechanical effort for applying pressure for joining of two wafers is greatly reduced. This applies especially to the use of this invention for wafer sizes starting at 300 mm in diameter, even more preferably at least 400 mm in diameter.

Therefore it is provided that the pressure surface be systematically and uniformly moved relative to the joining surface of the wafers, therefore parallel to the joining surface and that pressure be applied uniformly to the joining surface. In particular, especially the sum of the forces acting on the joining surface is homogeneously distributed along the surface. In other words, the total force acting at any point during application of pressure to the joining surface of the wafers is essentially identical, especially with a deviation of less than 20%, preferably less than 10%.

According to one advantageous embodiment of the invention, it is provided that the pressure surface is <80%, especially <60%, preferably <40% of the joining surface.

To the extent the pressure surface can be moved at least partially, especially completely along an action surface of one of the wafers facing away from the joining surface, the execution of the invention can be easily accomplished in mechanical terms. Here it is advantageous if the pressure surface acts on only one of the two wafers and the other wafer is fixed on a fixture, especially a chuck, in a blanket manner with its support surface facing away from the joining surface.

Furthermore it is advantageous if the bond pressure can be applied to one partial section of the joining surface corresponding to the pressure surface. This is especially the case when the pressure surface is in direct contact with the wafer and there are no elements or pressure plates or pressure distributors located in between. The pressure can be directly applied in this way and the action can be applied homogeneously along the joining surface.

By the pressure surface being exposed at least partially, especially completely to ultrasound, in addition to the pressure prevailing on the pressure surface an oscillation energy can be applied on the joining surface. This is especially advantageous when there is an oxide layer along the joining surface, therefore on the wafer surfaces which are to be joined. The delivery of ultrasonic oscillations is simplified especially in conjunction with the comparatively small pressure surface since the ultrasonic oscillations can be applied especially mechanically more easily because the force is accordingly smaller relative to the smaller pressure surface. The construction of the device therefore becomes more economical and a more homogeneous and careful application of pressure to the joining surface and/or exposure of the joining surface to oscillations is at first enabled in this way.

According to another more advantageous embodiment of the invention, it is provided that the pressure surface can be moved parallel to the action surface, especially linearly or rotationally.

A relative movement between the pressure surface and the action surface is decisive so that either the pressure transfer means are moved by corresponding drive means or the fixture of the wafer is moved, or, which would be correspondingly more complex, both the drive means for the pressure transfer means and also the fixture are moved.

To the extent the pressure surface is wedge-shaped, for wafers which are to be exposed to an action in a circle a more uniform force distribution arises along the joining surface, especially for rotational action.

To the extent the pressure surface is strip-shaped, especially with parallel longitudinal sides, especially for square or rectangular wafer surfaces the pressure distribution is homogeneous with the same expenditure of force. Otherwise the force distribution would have to be adapted to the action surface in contact with the pressure surface by corresponding control.

The above described features of the device or features of the method apply to the method described as claimed in the invention and vice versa.

Other advantages, features and details of the invention will become apparent from the following description of preferred exemplary embodiments and using the drawings.

BRIEF DESCRIPTION OF THE DRAWINGS

FIG. 2 shows a plan view of a second embodiment of the invention according to the present invention, FIG. 4b shows a side view of the embodiment as shown in FIG. 4a.

In the figures the same features or the features with the same effect are identified with the same reference numbers.

DETAILED DESCRIPTION OF THE INVENTION

Figure 1A:
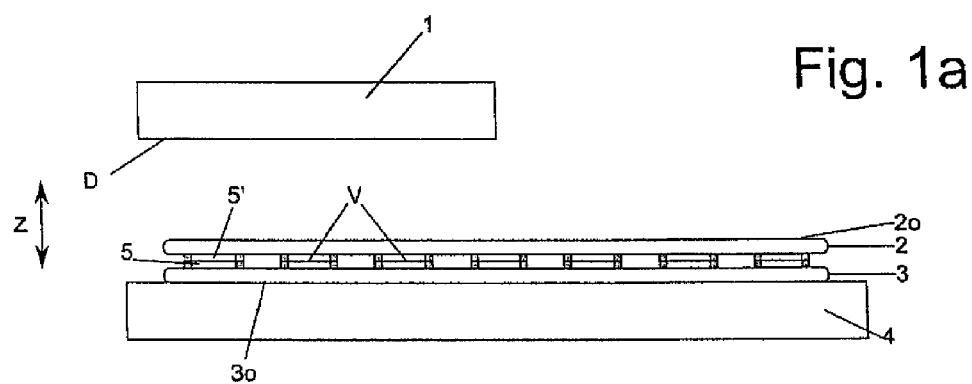
FIG. 1a shows a cross sectional view of a device according to the present invention in a first embodiment in a first method step in a side view.

FIG. 1 shows the device according to the present invention in highly schematic form, specifically a fixture 4 which is being used as a sample holder and which especially as a chuck is provided with vacuum paths which are not shown for fixing a structure wafer 3.

The structure wafer 3 is deposited with its fixture surface 3o in a blanket manner on the fixture 4 and optionally fixed there.

The fixture 4 is located in a bond chamber which can be exposed especially to a vacuum and which is assumed to be known and therefore is not detailed.

The first structure wafer 3, at least on its side facing away from the fixture surface 3o, has structures 5, especially electronic components.

A second structure wafer 2 (optionally with corresponding structured 5') is deposited on the first structure wafer 3 or the structures 5 located on the structure wafer 3 or makes contact with it. In a prior step the structure wafers 2, 3 are aligned to one another, for which there are corresponding alignment means (not shown).

Between the two structure wafers 2, 3 (more accurately: between the structures 5, 5' of the structure wafers 2, 3) contact-making yields a joining surface V on which the two structure wafers 2, 3 are joined to one another or on which the bond force at the end of the method according to the present invention after the two wafers 2, 3 are joined is to prevail. The joining surface V is generally insignificantly smaller than the respective surface of the structure wafers 2, 3 on the side of the structures 5, 5' since the structures 5, 5' are applied as closely (in a blanket manner) as possible on the respective surface of the structure wafers 2, 3 in order to increase the yield. In this respect the representation in the figures is highly schematic and the intermediate spaces between the structures 5, 5' are in reality much smaller.

Figure 1B:
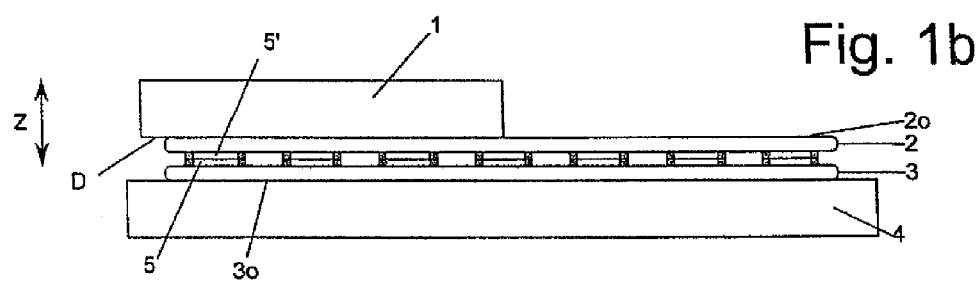
FIG. 1b shows the embodiment as shown in FIG. 1a in a second method step in a side view.

In the bond chamber the structure wafers 2, 3 can be exposed not only to a temperature, but in addition to a pressure by a pressure plate 1 as a component of the pressure transfer means being lowered into the position shown in FIG. 1b, a pressure surface D facing the fixture 4 or facing the structure wafers 2, 3 being lowered onto the action surface 2o of the second structure wafer 2. The pressure surface D is aligned parallel to the action surface 2o.

Figure 1C:
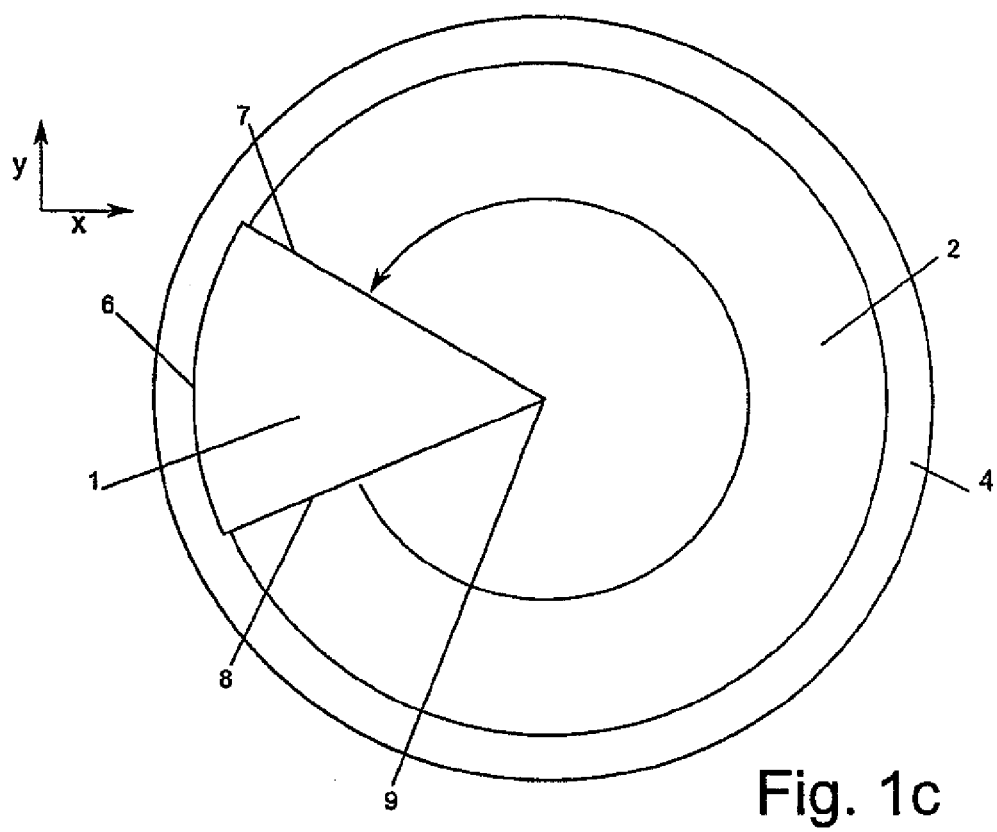
FIG. 1c shows the embodiment according to FIGS. 1a and 1b in a third method step in a plan view.

FIG. 1c shows in a plan view that only a partial section of the action surface 2o can be exposed to the pressure plate 1 at the same time since the pressure surface D of the pressure plate 1 is much smaller than the action surface 2o. The pressure plate 1 can be moved via corresponding drive means which are not shown on the one hand in a Z direction orthogonally to the joining surface or the action surface. FIG. 1c shows that in addition movement parallel to the action surface 2o or to the support surface of the fixture 4, therefore in an X-Y plane, can be executed by corresponding X-Y drive means.

In the case of the embodiment which is shown in FIG. 1c, the pressure plate 1 is rotated, the action surface 2o being exposed to pressure which is controlled by a control apparatus by the pressure surface D. The pressure can be measured by dynamometer means.

The pressure plate 1 or the pressure surface D is bordered by two radially running sides 7, 8 and one bent side 6. The bent side 6 is especially concentric to an intersection point 9 of the sides 7, 8. The intersection point 9 at the same time forms a tip of the pressure plate 1 which can be aligned centrically to the structure wafers 2, 3. At the same time the side 6 is made and can be arranged concentrically to the structure wafers 2, 3 and rotation of the pressure plate 1 which runs concentrically to the structure wafers 2, 3 can be executed. Thus the action surface 2o can be homogeneously exposed to pressure by the pressure plate 1, the application of pressure and rotational movement of the pressure plate 1 being controlled such that on the joining surface V essentially the same force has acted at the end at each point of the joining surface V. Thus a uniform bond is achieved along the joining surface.

The comparatively small pressure plate 1 or pressure surface D enables, in addition to the compressive force, the delivery of acoustic waves, especially by action on the pressure plate 1, on the joining surface V. Preferably ultrasonic waves are used which are intended to break possible oxide layers and to accelerate or promote the approaching of surface textures, therefore elevations and depressions. In combination with exposure to temperature, plastic deformation also occurs along the surface textures on the joining surface V of the opposite structures 5, 5', especially by shear stresses which are induced by means of the acoustic waves.

A pressure, especially in combination with the acoustic waves of an acoustic generator (not shown) which is provided on the pressure plate 1, acts by rotation of the pressure plate I in the underlying partial section of the action surface 2o and thus in the underlying partial section of the joining surface V. The pressure in the joining surface V is continuously distributed over the entire joining surface V by the rotation.

In the embodiment which is shown in FIG. 2, in addition to the pressure plate 1 there is a second pressure plate 15 which acts on the action surface 2o which has not been exposed to the pressure plate 1. The second pressure plate 15 is spaced apart from the pressure plate 1, especially equidistantly, and can be rotated by its own drive means, preferably independently, by the pressure plate 1, especially synchronously to the pressure plate 1. Thus in the region of the pressure plate 1 pressure can be applied with simultaneous exposure to sound and in the region of the second pressure plate 15 pressure can be applied (especially with the same pressure as for the pressure plate 1) according to the present invention, the second pressure plate 15 preferably not being exposed to acoustic waves.

A relative displacement of the structure wafers 2, 3 to one another is avoided by a relatively strong prebend taking place before movement of the pressure transfer means in the X-Y plane. This can take place for example by applying pressure over a certain time interval and/or by exposure to a temperature over a certain time interval and/or by fixing the structure wafers 2, 3 relative to one another, especially in the region of the periphery of the structure wafers 2, 3.

The embodiment shown in FIG. 2 thus enables almost blanket application of a homogeneous compressive force to the action surface 2o, and in the region of the pressure plate 1 oscillations can be delivered in addition.

Figure 3:
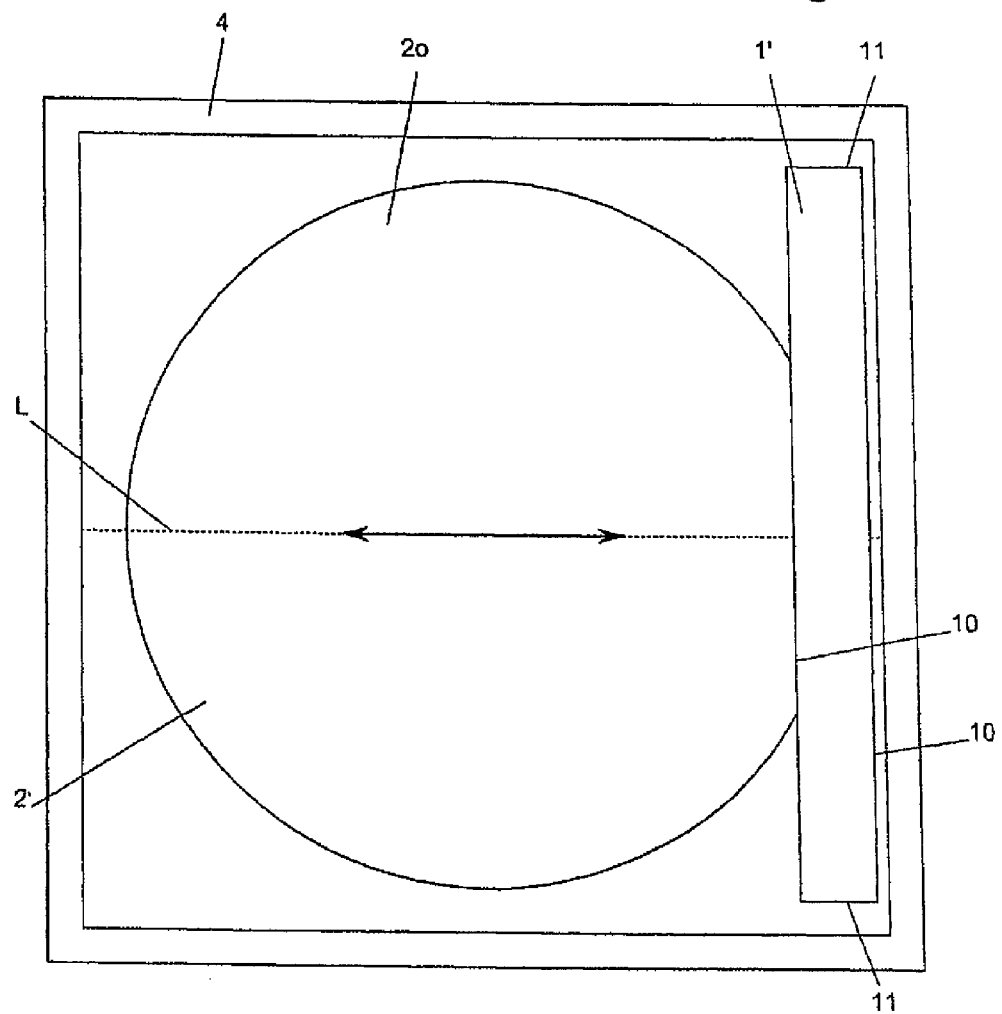
FIG. 3 shows a plan view of a third embodiment of this invention and FIG. 4a shows a plan view of a fourth embodiment of the invention.

In the embodiment which is shown in FIG. 3, the pressure is applied by linear motion along one linear direction L, there being one pressure plate 1' with a strip-shaped pressure surface D. The pressure surface D has two parallel longitudinal sides 10 and two sides 11 which join the two parallel longitudinal sides 10. The pressure plate 1' can be arranged such that the longitudinal sides 10 are arranged orthogonally to the linear direction 11.

The action surface 2o of the second structure wafer 2 is continuously bonded by linear movement and simultaneous application of pressure (and especially additional exposure to acoustic waves), otherwise the statements relating to FIG. 1 applying analogously to FIGS. 1a to 1c.

Figure 4A:
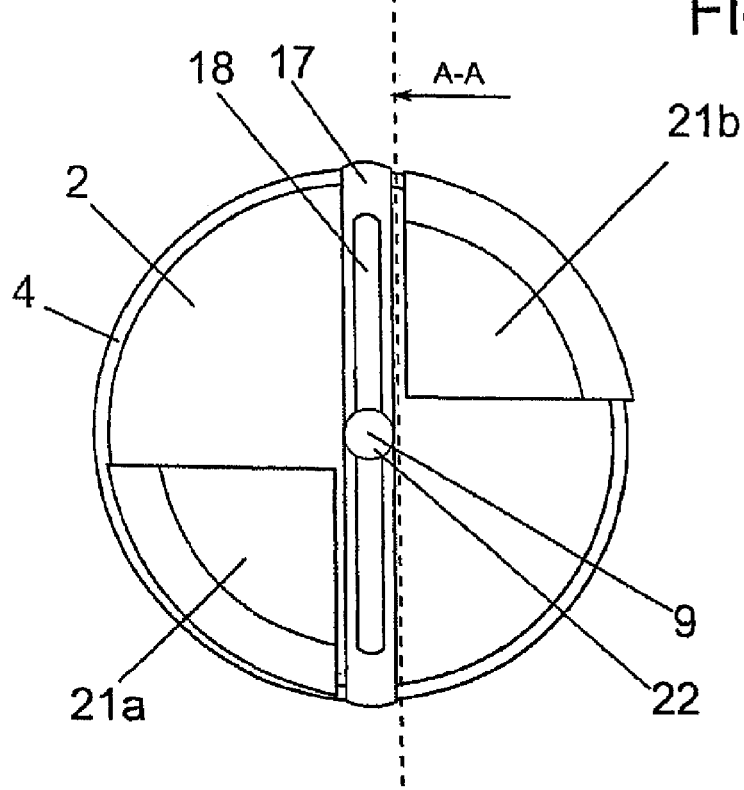
Figure 4B:
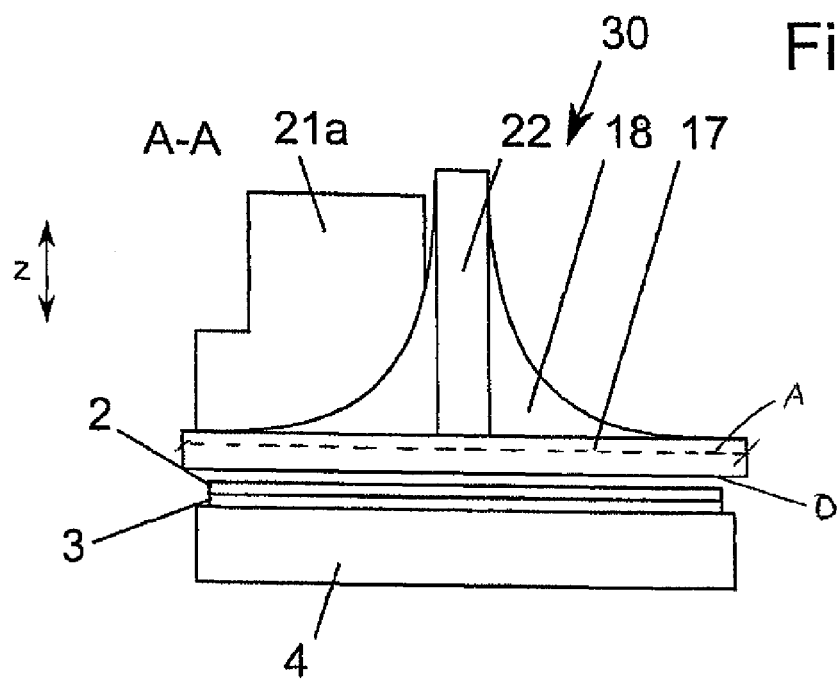

The embodiment shown in FIGS. 4a and 4b more or less represents a combination of the three embodiments according to FIGS. 1a, 1b, 1c, 2 and 3.

FIGS. 4a and 4b show a tool 30 as a component of the pressure transfer means, consisting of a pressure element 17 which runs conically towards a pressure surface D, a shaft 22 which acts on the pressure element 17, and support braces 18.

The tool 30 can oscillate or vibrate especially in the z direction. The pressure surface D in one longitudinal direction A is at least as long as the diameter of the second structure wafer 2 which is to be exposed to the action, especially at least 300 mm (length). Transversely to the longitudinal direction A, therefore in the transverse direction Q the pressure surface D of the pressure element 17 is conversely very thin, especially smaller than 10 mm, preferably smaller than 5 mm, even more preferably smaller than 1 mm (width). The respectively opposite sides of the pressure surface run parallel analogously to the embodiment as shown in FIG. 3. The ratio between the width and length is less than 1/30, especially less than 1/50, even more preferably less than 1/100.

The pressure element 17 can be rotated around the shaft 22, especially back and forth, the rotation drive means not being shown. The rotation takes place around a center of rotation 9, especially concentrically to the structure wafer 2 or to the fixture 4, assuming corresponding alignment of the structure wafers 2, 3.

By a static compressive force plungers 21a and 21b fix the wafers 2 and 3 so that a shifting of the wafers 2, 3 to one another is prevented during rotation of the pressure element 17.

The pressure element 17 makes contact with the surface 2o of the wafer 2. Preferably an oscillating or vibrating movement is superimposed on the static pressure. Afterwards the pressure element 17 begins to turn around the center of rotation 9. The plungers 21a and 21b limit the angular range of rotation to 90°, and rotation can be repeated several times in this angular range. During a 90° rotary motion roughly 50% of the area of the two wafers are bonded to one another. Afterwards the plungers 21a and 21b are raised off the action surface 2o so that it is unloaded. A 90° rotation of the two plungers 21a and 21b around the center of rotation 9 follows. The plungers 21a and 21b are afterwards pressed again onto the action surface 2o of the second wafer 2 and fix it. Finally, further 90° rotary motion of the tool around the center of rotation 9 takes place, which rotary motion is superimposed by static pressure and/or vibration and/or oscillation, in order to bond the remaining 50% of the wafer surfaces to one another. This process can be repeated several times.

The pressure plate 1, 1' can be structured with patterns. Preferably the patterns are regular.

Reference Number List 1, 1' pressure plate
2, 2' second structure wafer
2o, 2o' action surface
3 first structure wafer
3o fixture side
4 fixture
5, 5' structures
6 side
7 side
8 side
9 intersection point
10 longitudinal sides
11 sides
15 second pressure plate
V joining surface
D pressure surface
L linear direction Having described the invention, the following is claimed:

1. A device for bonding first and second wafers such that each of said first and second wafers are joined to each other, directly or indirectly, at a joining surface V located between the first and second wafers, said device comprising:
a holder for holding the first wafer having first and second surfaces, the second surface facing the holder;
pressure transfer means having a pressure surface D that contacts a first surface of the second wafer for applying a bond pressure to the first and second wafers, said pressure surface D is smaller than the joining surface V, wherein a second surface of the second wafer faces toward the first surface of the first wafer; and
means for contacting the pressure surface D, in succession, with a plurality of partial sections of the first surface of the second wafer, thereby applying the bond pressure at a respective plurality of partial sections of the joining surface V.

2. The device as claimed in claim 1, wherein the pressure surface D is <80% of the joining surface V.

3. The device as claimed in claim 1, wherein the pressure surface D is moved at least partially along the first surface of the second wafer.

4. The device as claimed in claim 1, wherein each of said partial sections of the joining surface V corresponds to the pressure surface D.

5. The device as claimed in claim 1, wherein the pressure surface D is exposed at least partially to ultrasound.

6. The device as claimed in claim 1, wherein the pressure surface D moves linearly or rotationally parallel to the first surface of said second wafer.

7. The device as claimed in claim 1, wherein the pressure surface D is wedge-shaped.

8. The device as claimed in claim 1, wherein the pressure surface D is strip-shaped.

9. A method for bonding first and second wafers at one joining surface V located between the first and second wafers, wherein the first and second wafers are, directly or indirectly, joined together at the joining surface V, said method comprising:
holding the first wafer having first and second surfaces;
contacting a pressure surface D of a pressure transfer means with a first surface of the second wafer to apply a bond pressure to the first and second wafers, wherein a second surface of the second wafer faces toward the first surface of the first wafer; and
applying the bond pressure, in succession, to a plurality of partial sections of the first surface of the second wafer, thereby applying the bond pressure at a respective plurality of partial sections of the joining surface V.

10. The device as claimed in claim 8, wherein the pressure surface D has parallel longitudinal sides.

11. The device as claimed in claim 1, wherein one or more structures are located on the first surface of the first wafer and/or the second surface of the second wafer, said joining surface V located at a surface of the one or more structures.

12. The method as claimed in claim 9, wherein one or more structures are located on the first surface of the first wafer and/or the second surface of the second wafer, said joining surface V located at a surface of the one or more structures.

* * * * *